United States Patent [19]

Kim

[11] Patent Number: 5,031,309
[45] Date of Patent: Jul. 16, 1991

[54] COMPONENT ASSEMBLING MACHINE DRIVING METHOD

[75] Inventor: Jong-Moon Kim, Suwon, Rep. of Korea

[73] Assignee: Samsung Electronics Co., Ltd., Suwon, Rep. of Korea

[21] Appl. No.: 384,700

[22] Filed: Jul. 25, 1989

[30] Foreign Application Priority Data

Jul. 26, 1988 [KR] Rep. of Korea ............ 88-9402

[51] Int. Cl.⁵ .................................... H05K 3/30
[52] U.S. Cl. .................................... 29/832; 29/741
[58] Field of Search ............ 29/832, 837, 707, 709, 29/740, 741

[56] References Cited

U.S. PATENT DOCUMENTS 4,202,092 5/1980 Shibisaki et al. ............ 29/741
4,805,110 2/1989 Takahashi et al. ............ 29/741

FOREIGN PATENT DOCUMENTS 62-106516 5/1987 Japan.
62-165066 7/1987 Japan.

Primary Examiner—P. W. Echols
Attorney, Agent, or Firm—Sterne, Kessler, Goldstein & Fox

[57] ABSTRACT

A component assembling machine driving device and a method thereof are disclosed, in which a cam is used as the principal device for realizing speedy operations, in which a position controller and a sequence controller are capable of monitoring the state of the cam by means of a simple combination of sensors, and in which different operations are carried out simultaneously, thereby achieving speedy operations, but preventing interferences between different operations.

1 Claim, 5 Drawing Sheets

FIG. 2. A
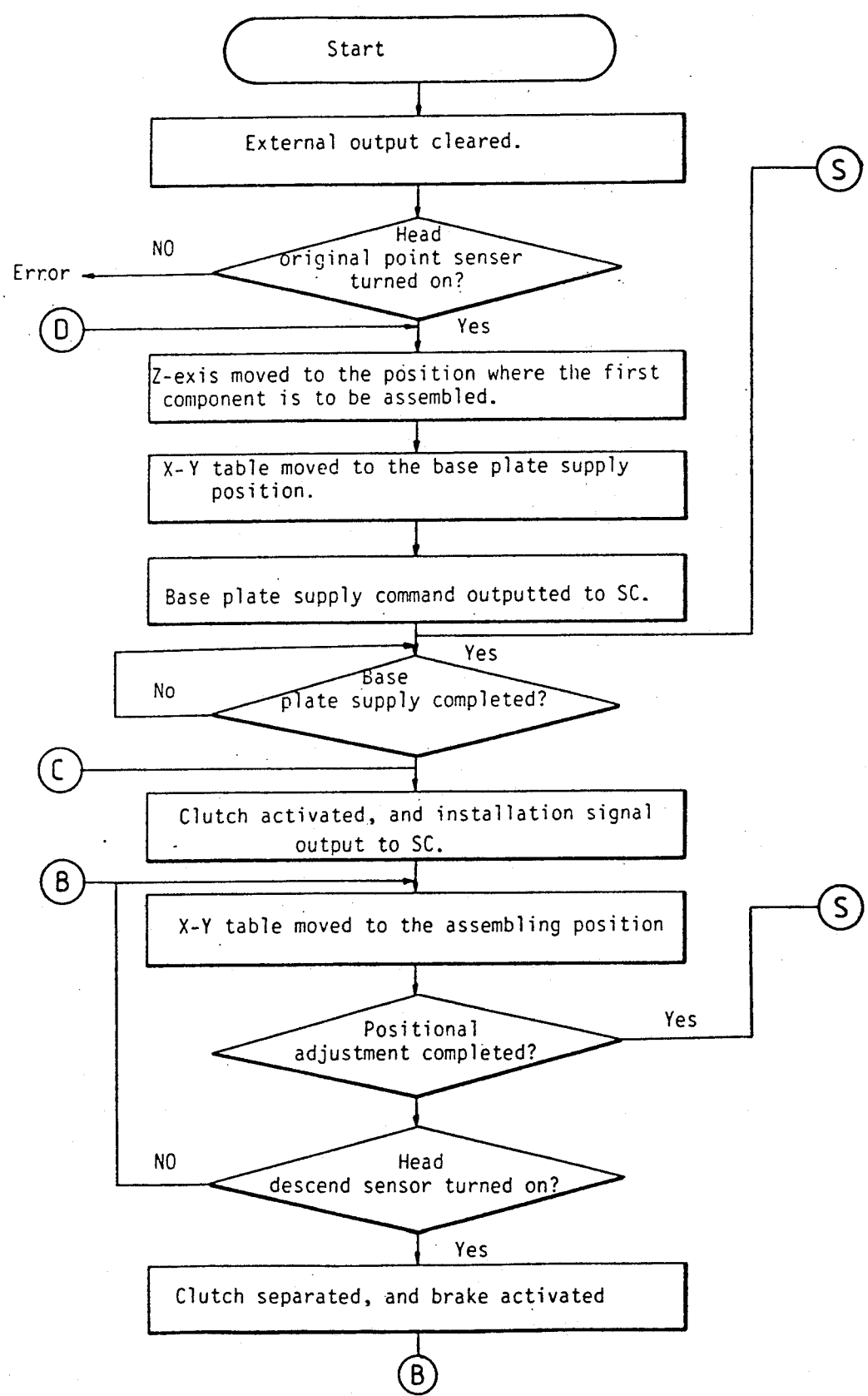

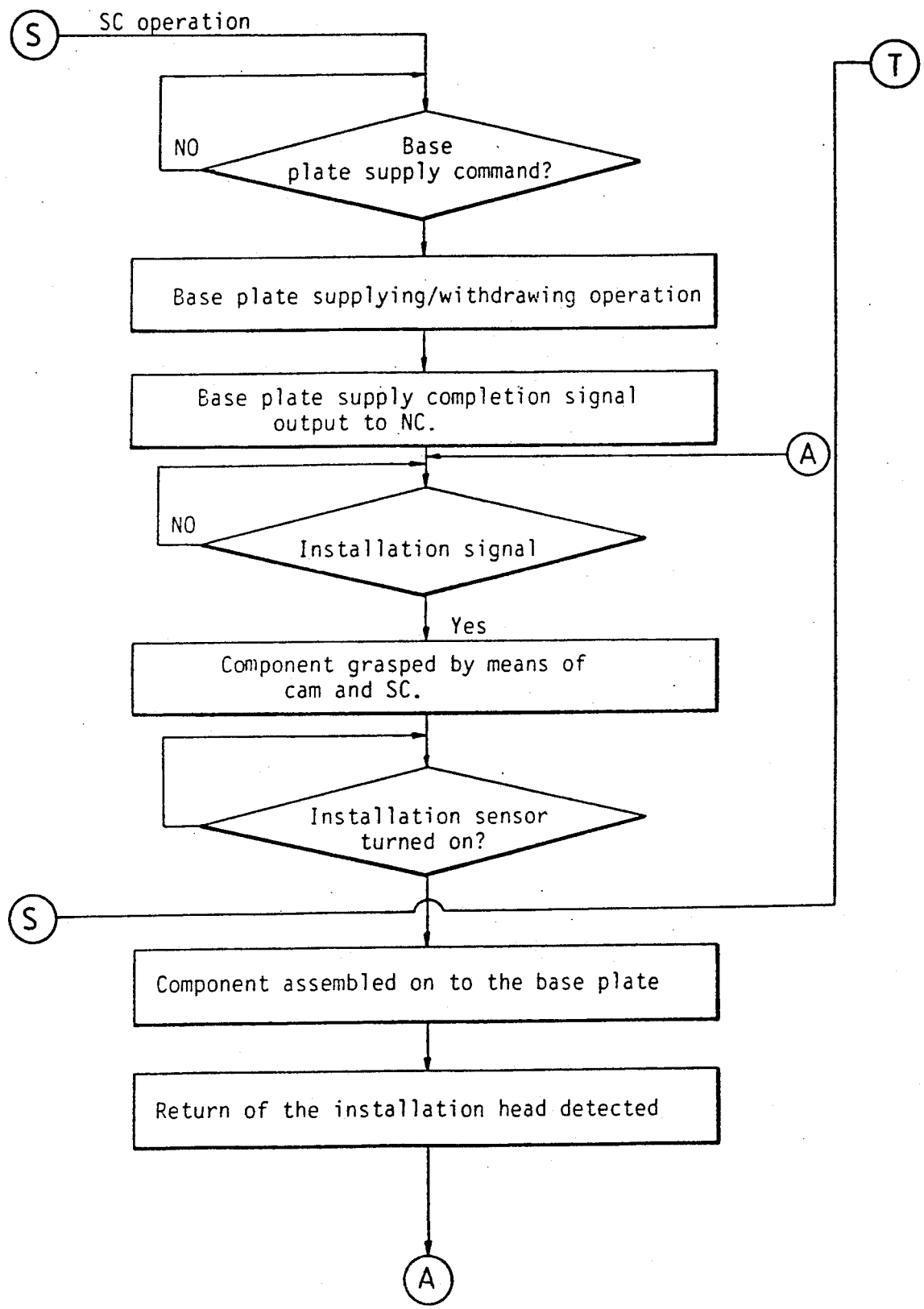
FIG. 2.B

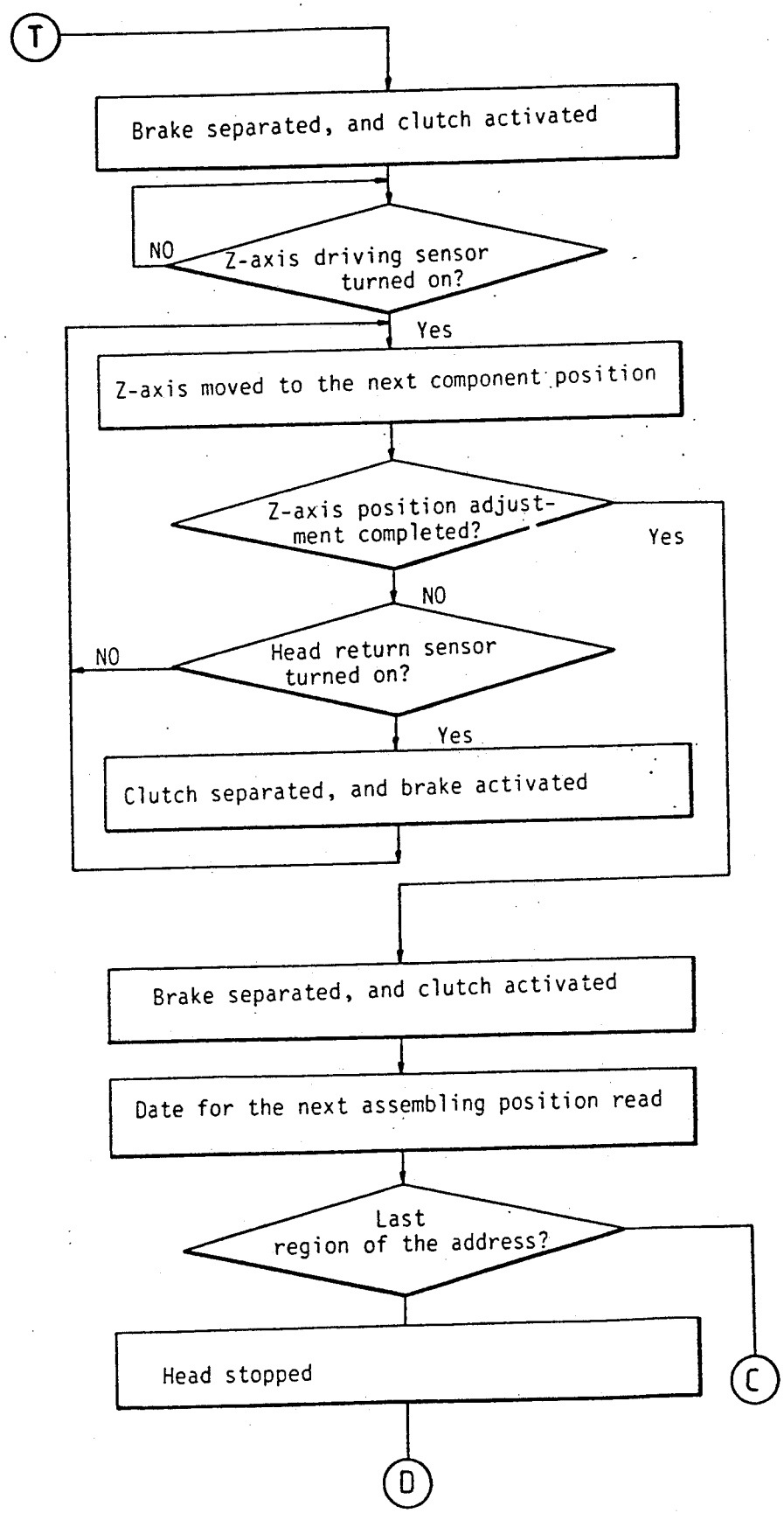
FIG. 2.C

COMPONENT ASSEMBLING MACHINE DRIVING METHOD

FIELD OF THE INVENTION

The present invention relates to a component assembling machine driving device using a cam as the driving source and a methed thereof, and particularly to a component assembling machine driving device and a method thereof, in which a cam is used as the driving power source for the head, and in which speedy operations are made possible by means of simple and sparse control signals and using the signals of a cam sensor (for monitoring the state of the head) as enable signals.

BACKGROUND OF THE INVENTION

In the conventional component assembling machines, a position controller interconnected with a sequence controller governs the timings of operations. Therefore, the operation of the sequence controller is accomplished after the completion of the operation of the position controller, with the result that the assembling speed becomes very slow (0.8 seconds per assembling), and that, in the case where the head is driven by means of only a solenoid, time is required for actuation of the solenoid and for the operation of an air pressure section.

SUMMARY OF THE INVENTION

The present invention is intended to overcome the above described disadvantages of conventional assembling machines.

Therefore, it is the object of the present invention to provide a component assembling machine driving device and a method thereof, in which a cam is used as the principal means for realizing speedy operations, in which a position controller and a sequence controller are operable to monitor the state of the cam by means of a simple combination of sensors, and in which the respective operations are carried out simultaneously, thereby preventing the interference between different operations as providing well as speedy operations (0.5 seconds per assembly).

BRIEF DESCRIPTION OF THE DRAWINGS

The above object and other advantages of the present invention will become more apparent by describing in more detail the preferred embodiment of the present invention with reference to the attached drawings in which:

FIGS. 2A, 2B and 2C comprise a flow chart showing the operation of the device of the present invention.

DESCRIPTION OF THE PREFERRED EMBODIMENT

Figure 1:
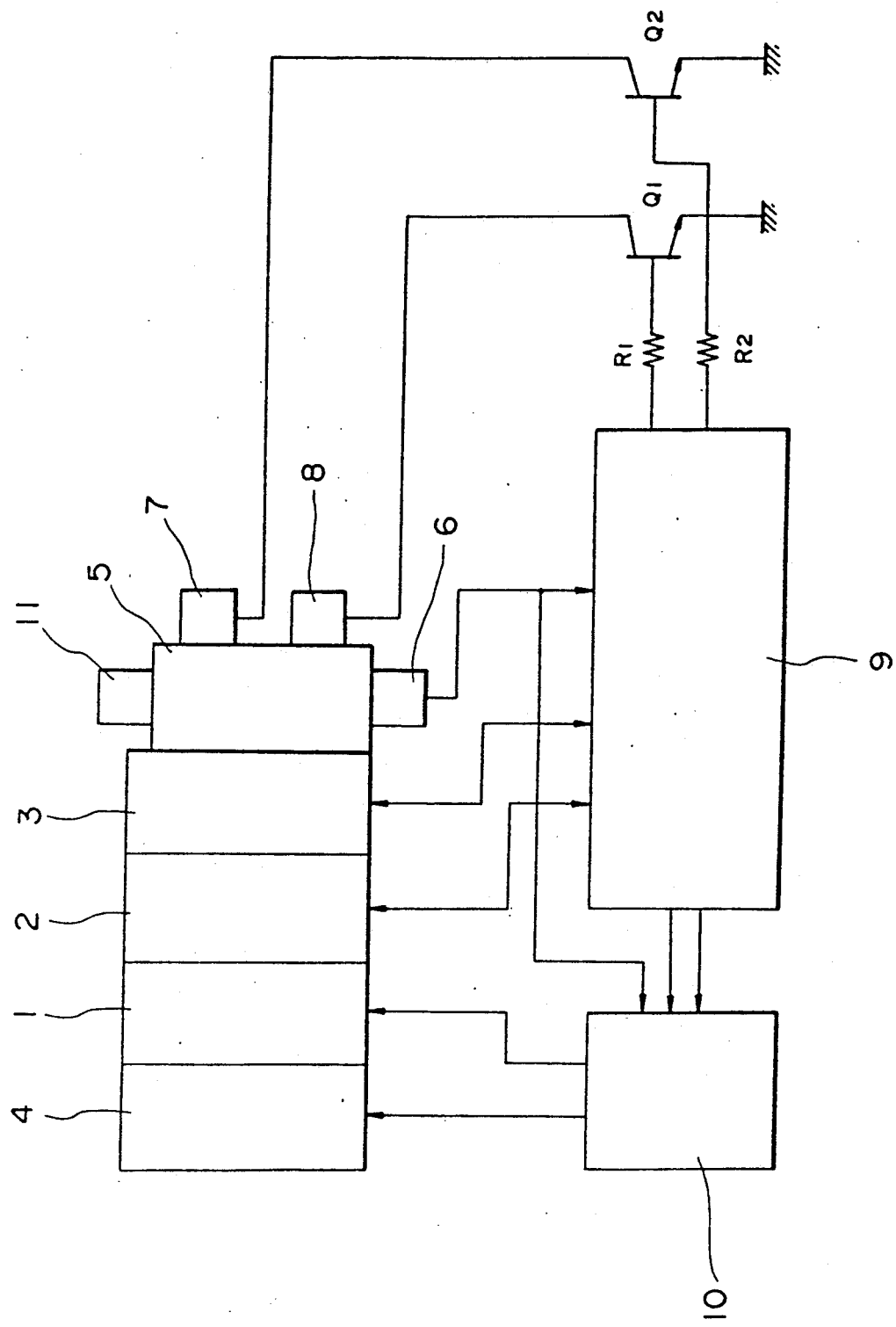
FIG. 1 illustrates the constitution of the system according to the present invention.

As shown in FIG. 1 in which the constitution of the system of the present invention is illustrated, the device of the present invention comprises:

a solenoid means 1 consisting of a combination of all the solenoids required for the sequence operations;

an X-Y table 2 for carrying out the positional adjustments of a base plate in a position of the assembling of components;

a Z-axis component conveyor means 3 for transferring various components to be assembled to a securing head;

a base plate supplying/withdrawing means 4 for supplying the base plate for the assembling of components on the X-Y table which carries out the positional controls of the base plate, and for withdrawing the base plate upon completion of the assembling of components:

a cam 5 which is coupled with a securing head for deciding the driving power performing the assembling operation of components, and for being revolved at constant speed by an induction motor (not shown);

a cam sensor means 6 consisting of a head original point sensor S1, a head descending sensor S2, an installation sensor S3, a Z-axis driving sensor S4, and a head return sensor S5 for detecting the operating position of the cam 5 (the current angle of the cam) externally;

a clutch 7 for transmitting the driving power of the induction motor to the cam;

a brake 8 for stopping the revolution of the cam 5;

a position controller means 9 for controlling the operations of the clutch 7 and the brake 8 in accordance with the monitoring signals from the cam sensor means 6, for controlling the positions of the X-Y table 2 and the Z-axis component conveyor means 3, and for carrying out the interfacing to a sequence controller 10; and a sequence controller means 10 for controlling all the sequence operations in accordance with the condition monitoring data output from the positional controller means 9 and the cam sensor means 6.

Reference code 11 indicates the securins head, R1, R2 indicate bias resistances, and Qu, Q2 indicate drive transistors.

The operation of the present invention as disclosed above will now be described as to its functions by referring to the flow chart of FIGS. 2A-2C.

Upon applying power, the position controller means 9 will adjust the position of the X-Y table 2 to a predetermined base plate supply position in order to receive a base plate on which the components will be assembled. Further, the position controller means 9 will activate the Z-axis component conveyor means 3 so that the means 3 should move the component to be assembled first to the position of the securing head 11. If the head 11 is in a descended position, the X-Y table 2 and the Z-axis component conveyor means 3 will collide with each other.

Figure 3:
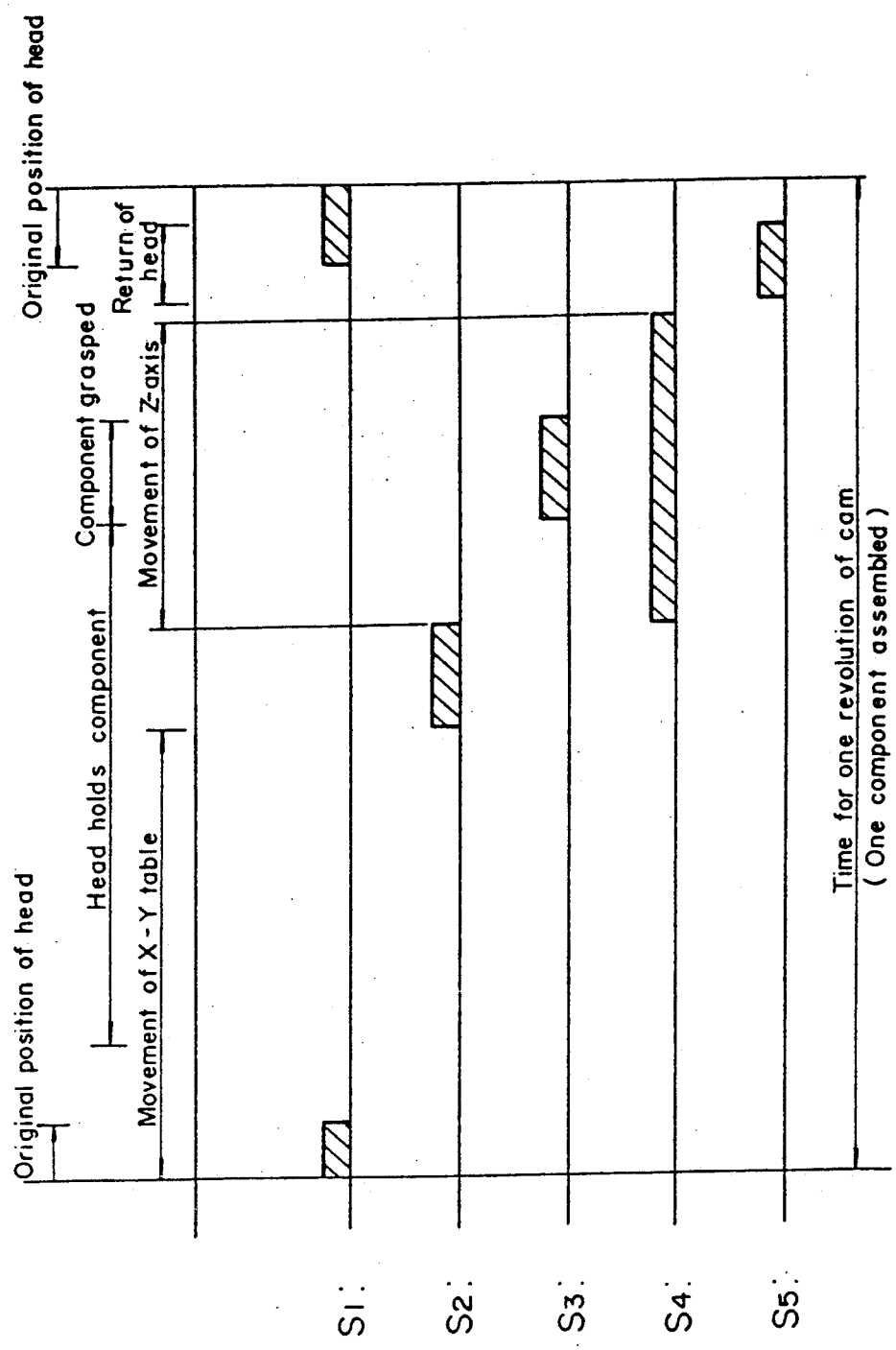
FIG. 3 is a graphical illustration showing the relationships between the ON/OFF states of the sensor and the operations of the cam.

Therefore, after the head original point sensor S1 of the cam sensor means 6 is checked, and if the head original point sensor S1 is turned on as shown in FIG. 3, if the head 11 is returned to the original point, then there will be no danger. At this point, the X-Y table 2 is moved to the base plate supply position, and the Z-axis component conveyor means 3 is moved to the position where the first component to be assembled is located.

After the X-Y table 2 is positioned to the base plate supply position, the position controller 9 will output a base plate supply command, and will wait.

Under this condition, if the X-Y table 2 moves, it will collide with the base plate supplying/withdrawing means 4.

Meanwhile, the sequence controller 10 which has received the base plate supply command from the position controller means 9 will carry out the base plate supplying operation through the base plate supplying/withdrawing means 4 to supply a new base plate to the X-Y table 2, and then, will send a base plate supply completion signal to the position controller means 9.

After the receipt of the base plate supply completion signal, the position controller means 9 will control the component assembling operation. That is, first the driving power of the induction motor (not shown) will be transmitted through the clutch 7 to the cam 5 so that the cam 5 should be revolved. Then, the position controller means 9 will output the installation signals to the sequence controller 10, so that the different solenoids of the solenoid means 1 required for assembling of components should be properly activated in accordance with the monitoring signals from the cam sensor means 6, while the position controller means 9 will also move the X-Y table 2 to the component assembling position.

Then, the components will be supplied by the cam 5 and the sequence controller 10, and therefore, if the Z-axis component conveyor means 3 is moved, the Z-axis component conveyor means 3 and the head 11 will collide with each other. Accordingly, the Z-axis component conveyor means 3 will not be moved.

If the head 11 descends during the movement of the X-Y table 2 toward the assembling position, there is the possibility that the components can be assembled in incorrect positions, or that the head 11 can be damaged, and therefore, the position controller means 9 will control the position of the X-Y table 2, and at the same time, will supervise the head descending sensor S2. If the head descending sensor S2 is turned on as shown in FIG. 3B in a state in which the positional adjustment is not completed, then the clutch 7 will be separated in haste, and the brake 8 will be actuated to inhibit the descending of the head; Thereafter the positional control of the X-Y table is performed continuously.

If the positional adjustment of the X-Y table is completed, the brake 8 will be inactivated, and the clutch 7 will be activated, so that the components will be continuously assembled on the base plate.

During this time, if the installation sensor S3 is turned on as shown in FIG. 3C, then the assembling of the components on the base plate will be carried out by the cam 5 and the sequence controller 10.

Here, the position controller means 9 will move Z-axis component conveyor means 3 after the completion of the positional adjustment of the X-Y table 2, and by this time, the head 11 will be located on a plane different from that of the Z-axis component conveyor means 3. Therefore, even if the Z-axis component conveyor means 3 is moved, no collision will occur.

If the Z-axis driving sensor S4 is turned on as shown in FIG. 3, the position controller means 9 of FIG. 1 will move the Z-axis component conveyor means 3 to the next assembling position.

During the process of moving the Z-axis component conveyor means 3 to the next assembling position, there is a possibility of collision between the Z-axis component conveyor means 3 and the head return sensor S5 during the position-controlling of the Z-axis component conveyor 3. If the head return sensor S5 is turned on before the completion of the positional adjustment of the Z-axis component conveyor means 3, then the position controller means 9 will separate the clutch 7 and activate the brake 8. In doing this any collision between the head 11 and the Z-axis component conveyor means 3 is prevented.

If the positional adjustment of the Z-axis component conveyor means 3 is completed, then the brake 8 will be separated, the clutch 7 will be activated, and the operation for the next assembling process will be started, while the data for the next cam assembling position will be read from a memory device (not shown).

A judgement will be made as to whether the read-out data corresponds to the last region of the assembly. If it does, then the head 11 will be stopped, and will re-carry out the program from the first step in order to receive another base plate, while if the read-out data does not correspond to the last region of the assembly, then the third step will be re-carried out in order to continue the assembling of the remaining portion.

If there no head descend signal is generated during the period of time from the start of the moving of the X-Y table 2 to the completion of the positional adjustment of the same, then the cam 5 will not be stopped. Further, during the movement of the Z-axis component conveyor means 3, if the positional adjustment of the Z-axis component conveyor means 3 is completed before the head return sensor S3 is turned on, then the cam 5 will also not be stopped.

By monitoring the ON/OFF states of the cam sensor means 6 for detecting the state of the head 11, the position controller means 9 and the sequence controller 10 can properly maintain control. Further, the cam 5 maintains a constant speed by means of the induction motor (not shown) under these conditions, and therefore, the assembling process can be speedily carried out.

As described above, the device of the present invention is constituted such that the cam 5 is operated by the same driving power as that for the head 11, and the signals from the cam sensor means 6 for monitoring the state of the head 11 serve as enable signals, with the result that speedy assembling can be realized through the use of simple and sparse control signals.

What is claimed is:

1. A component assembling machine driving method having a solenoid means consisting of a combination of solenoids required for different sequence operations; an X-Y table for carrying out positional controls for base plates to put them into assembling position; a Z-axis component conveyor means for moving components to be assembled to the position of a securing head; and a base plate supplying/withdrawing means for supplying the base plates to said X-Y table which carries out the positional control of the base plates, and for withdrawing the base plates upon completion of assembling, comprising:

a first step in which a turning-on state of a head original point sensor S1 is checked, and if it is turned on, then said Z-axis component conveyor means is moved to the position of the component to be first assembled, said X-Y table is moved to a base plate supply position, and a base plate supply command is outputted to a sequence controller;

a second step in which, after completion of a base plate supplying operation upon receipt of the base plate supply command, in said first step, a base plate supply completion signal is outputted to a position controller;

a third step in which, upon receipt of the base plate supply completion signal in said second step, a clutch is activated, an installation signal is outputted to said sequence controller, and said X-Y table is moved to the assembling position;

a fourth step in which, if a head descend sensor S2 is turned on before the movement of said X-Y table to the assembling position, then said clutch is separated, a brake is activated, and the position of said X-Y table is continuously adjusted;

a fifth step in which, if the positional adjustment of said X-Y table is completed in the fourth step above, then said brake is separated, and said clutch is activated;

a sixth step in which, after grasping of a component upon receipt of an installation signal from a position controller, if an installation sensor S3 is turned on, then the grasped component is assembled on the base plate;

a seventh step in which, if a Z-axis driving sensor S4 is turned on after completion of positional adjustment of said X-Y table, then said Z-axis component conveyor means is moved to a position where the next assembly is to be carried out;

an eighth step in which, if a head return sensor S5 is turned on before completion of positional adjustment of said Z-axis component conveyor means, then said clutch is separated, said brake is activated, and the positional adjustment of said Z-axis component conveyor means is continuously carried out;

a ninth step in which, if the positional adjustment of said Z-axis component conveyor means is completed in said eighth step, then said brake is separated, said clutch is activated, and the data for the position of the next assembly is read; and a tenth step in which, if the read-out data corresponds to a last region of the assembly, then the head is stopped, and said first step is re-carried out in order to receive another base plate, while, if the read-out data does not correspond to the last region of the address, then said third step is re-carried out in order to continue the assembly.

* * * * *